(12) United States Patent
Zhang et al.

(10) Patent No.: US 10,012,670 B2
(45) Date of Patent: Jul. 3, 2018

(54) WAFER BONDING METHOD FOR USE IN MAKING A MEMS GYROSCOPE

(71) Applicant: InSighTech, LLC, Los Angeles, CA (US)

(72) Inventors: Biao Zhang, Hinsdale, IL (US); Tao Ju, Beijing (CN)

(73) Assignee: Insigh Tech, LLC, Los Angeles, CA (US)

( * ) Notice: Subject to any disclaimer, the term of this patent is extended or adjusted under 35 U.S.C. 154(b) by 856 days.

(21) Appl. No.: 14/518,688

(22) Filed: Oct. 20, 2014

(65) Prior Publication Data
US 2015/0034620 A1 Feb. 5, 2015

Related U.S. Application Data

(63) Continuation of application No. 13/559,625, filed on Jul. 27, 2012, now abandoned, and a continuation of
(Continued)

(51) Int. Cl.
| | |
|---|---|
| *H04R 31/00* | (2006.01) |
| *G01P 15/105* | (2006.01) |
| *G01C 19/56* | (2012.01) |
| *B81B 5/00* | (2006.01) |
| *G01C 19/5776* | (2012.01) |
| *G01C 19/5712* | (2012.01) |
| *B81C 1/00* | (2006.01) |
| *B81C 3/00* | (2006.01) |
| *G01R 33/09* | (2006.01) |
| *G01P 15/125* | (2006.01) |

(52) U.S. Cl.
CPC .............. *G01P 15/105* (2013.01); *B81B 5/00* (2013.01); *B81C 1/00357* (2013.01); *B81C 3/001* (2013.01); *G01C 19/56* (2013.01); *G01C 19/5712* (2013.01); *G01C 19/5776* (2013.01); *G01P 15/125* (2013.01); *G01R 33/091* (2013.01); *G01R 33/093* (2013.01); *G01R 33/098* (2013.01); *B81C 2201/0197* (2013.01); *B81C 2203/038* (2013.01)

(58) Field of Classification Search
CPC ....... B81C 1/00357; B81C 3/001; B81B 5/00; G01C 19/56; G01C 19/5776; G01C 19/5712; G01P 15/105; G01P 15/125; G01R 33/091; G01R 33/093; G01R 33/098

See application file for complete search history.

(56) References Cited

U.S. PATENT DOCUMENTS 5,837,895 A * 11/1998 Fujimoto ........... G01C 19/5642
73/504.02
5,911,156 A * 6/1999 Ward .................. G01C 19/5719
73/504.16
(Continued)

OTHER PUBLICATIONS

U.S. Appl. No. 12/723,964, filed Mar. 15, 2010, Johnson et al.
(Continued)

*Primary Examiner* — Paul D Kim
(74) *Attorney, Agent, or Firm* — Treasure IP Group, LLC

(57) ABSTRACT

A method of making a MEMS gyroscope is disclosed herein, wherein the MEMS gyroscope comprised a magnetic sensing mechanism on a magnetic sensor wafer and a magnetic source on a MEMS wafer that further comprises a proof-mass.

6 Claims, 7 Drawing Sheets

Related U.S. Application Data application No. 13/854,972, filed on Apr. 2, 2013, now abandoned.

(56) References Cited

U.S. PATENT DOCUMENTS

| | | | | |
|---|---|---|---|---|
| 5,932,804 | A * | 8/1999 | Hopkin | G01C 19/5677 |
| | | | | 73/504.13 |
| 6,133,670 | A | 10/2000 | Rodgers et al. | |
| 6,313,562 | B1 | 11/2001 | Barnes et al. | |
| 8,397,568 | B2 * | 3/2013 | Cardarelli | G01P 21/00 |
| | | | | 73/504.04 |
| 2004/0055381 | A1 * | 3/2004 | Shcheglov | B81C 3/001 |
| | | | | 73/504.12 |
| 2006/0115323 | A1 * | 6/2006 | Coppeta | A61K 9/0097 |
| | | | | 403/270 |
| 2006/0162146 | A1 * | 7/2006 | Shcheglov | G01C 19/5684 |
| | | | | 29/594 |
| 2007/0084042 | A1 * | 4/2007 | Challoner | G01C 19/5684 |
| | | | | 29/592.1 |
| 2007/0209437 | A1 * | 9/2007 | Xue | B81B 3/0032 |
| | | | | 73/514.31 |
| 2008/0295622 | A1 * | 12/2008 | Challoner | G01C 19/5684 |
| | | | | 74/5.6 D |
| 2009/0095077 | A1 * | 4/2009 | Denatale | G01C 19/5684 |
| | | | | 73/504.13 |
| 2010/0251817 | A1 * | 10/2010 | Ge | B81B 7/0058 |
| | | | | 73/504.12 |
| 2010/0251818 | A1 * | 10/2010 | Ge | G01C 19/5684 |
| | | | | 73/504.12 |
| 2011/0048130 | A1 * | 3/2011 | Krylov | G01C 19/56 |
| | | | | 73/504.12 |

OTHER PUBLICATIONS

U.S. Appl. No. 13/003,468, filed Jul. 10, 2009, Fell et al.

A Compact Angular Rate Sensor System Using a Fully Decoupled Siliconon-Glass MEMS Gyroscope• J. of Microelectromechanical Systems, vol. 17, No. 6, Dec. 2008.

A Single Layer Silcon-on-Insulator MEMS Gyroscope for Wide Dynamic Range and harsh Environment Applications,• Proceedings of SPIE vol. 4559(2001).

"Inertial Sensor Technology Trend" IEEE Sensors Journal, vol. 1, No. 4, Dec. 2001, p. 332.

Fabrication, Characterization, and Analysis of a DRIE CMOS-MEMS Gyroscope•. IEEE Sensors Jiurnal, vol. 3, No. 5 Oct. 2005, p. 622.

Single crystal silicon MEMS fabrication based on smart-cut technique• Sensors and Actuators A 112 (2004) 116-121.

Sensitivity enhancement of MEMS inertial sensors using negative springs and active control Sensors and Actuators A 97-98 (2002) 153-160.

* cited by examiner

WAFER BONDING METHOD FOR USE IN MAKING A MEMS GYROSCOPE

CROSS-REFERENCE

This US utility patent application claims priority from co-pending US utility patent application "A HYBRID MEMS DEVICE," Ser. No. 13/559,625, filed Jul. 27, 2012, now abandoned, which claims priority from US provisional patent application "A HYBRID MEMS DEVICE," filed May 31, 2012, Ser. No. 61/653,408 to Biao Zhang and Tao Ju. This US utility patent application also claims priority from co-pending US utility patent application "A MEMS DEVICE," Ser. No. 13/854,972, filed Apr. 2, 2013, now abandoned, to the same inventor of this US utility patent application, the subject matter of each of which is incorporated herein by reference in its entirety.

TECHNICAL FIELD OF THE DISCLOSURE

The technical field of the examples to be disclosed in the following sections is related generally to the art of operation of microstructures, and, more particularly, to operation of MEMS devices comprising MEMS magnetic sensing structures.

BACKGROUND OF THE DISCLOSURE

Microstructures, such as microelectromechanical (hereafter MEMS) devices (e.g. accelerometers, DC relay and RF switches, optical cross connects and optical switches, microlenses, reflectors and beam splitters, filters, oscillators and antenna system components, variable capacitors and inductors, switched banks of filters, resonant comb-drives and resonant beams, and micromirror arrays for direct view and projection displays) have many applications in basic signal transduction. For example, a MEMS gyroscope measures angular rate.

A gyroscope (hereafter "gyro" or "gyroscope") is based on the Coriolis effect as diagrammatically illustrated in FIG. 1. Proof-mass 100 is moving with velocity $V_d$. Under external angular velocity $\Omega$, the Coriolis effect causes movement of the poof-mass (100) with velocity $V_s$. With fixed $V_d$, the external angular velocity can be measured from $V_d$. A typical example based on the theory shown in FIG. 1 is capacitive MEMS gyroscope, as diagrammatically illustrated in FIG. 2.

The MEMS gyro is a typical capacitive MEMS gyro, which has been widely studied. Regardless of various structural variations, the capacitive MEMS gyro in FIG. 2 includes the very basic theory based on which all other variations are built. In this typical structure, capacitive MEMS gyro 102 is comprised of proof-mass 100, driving mode 104, and sensing mode 102. The driving mode (104) causes the proof-mass (100) to move in a predefined direction, and such movement is often in a form of resonance vibration. Under external angular rotation, the proof-mass (100) also moves along the $V_s$ direction with velocity $V_s$. Such movement of $V_s$ is detected by the capacitor structure of the sensing mode (102). Both of the driving and sensing modes use capacitive structures, whereas the capacitive structure of the driving mode changes the overlaps of the capacitors, and the capacitive structure of the sensing mode changes the gaps of the capacitors.

Current capacitive MEMS gyros, however, are hard to achieve submicro-g/rtHz because the capacitance between sensing electrodes decreases with the miniaturization of the movable structure of the sensing element and the impact of the stray and parasitic capacitance increase at the same time, even with large and high aspect ratio proof-masses.

Therefore, what is desired is a MEMS device capable of sensing angular velocities and methods of operating the same.

SUMMARY OF THE DISCLOSURE

In view of the foregoing, a method of making a MEMS gyroscope is disclosed herein, the method comprising: providing a first substrate; processing the first substrate, comprising: forming a heater in an bonding area, comprising: depositing a conductive material on a surface having the bonding area of the first substrate; patterning the conductive material so as to form the heater; depositing an insulating layer on the patterned heater; patterning the first substrate so as to form a cavity surrounded by a pillar; forming a magnetic source at a surface of the MEMS wafer inside the cavity; providing a second wafer that comprises a magnetic sensor; bonding the first and second wafers at the bonding area so as to form a wafer assembly, further comprising: driving current through the heater so as to raise the temperature of the bonding material; and bonding the first and second wafer by using the bonding material at the raised temperature; and processing the MEMS wafer of the wafer assembly so as to form a movable portion.

DETAILED DESCRIPTION OF SELECTED EXAMPLES

Disclosed herein is a MEMS gyroscope for sensing an angular velocity, wherein the MEMS gyroscope utilizes a magnetic sensing mechanism. It will be appreciated by those skilled in the art that the following discussion is for demonstration purposes, and should not be interpreted as a limitation. Many other variations within the scope of the following disclosure are also applicable. For example, the MEMS gyroscope and the method disclosed in the following are applicable for use in accelerometers.

Figure 1:
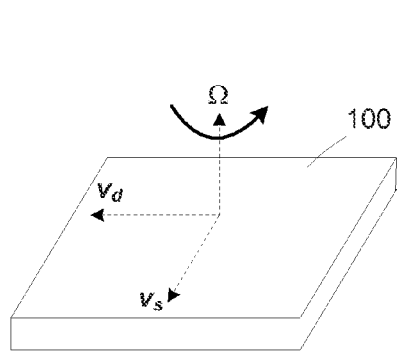
FIG. 1 diagrammatically illustrates the Coriolis effect in a MEMS structure.
Figure 2:
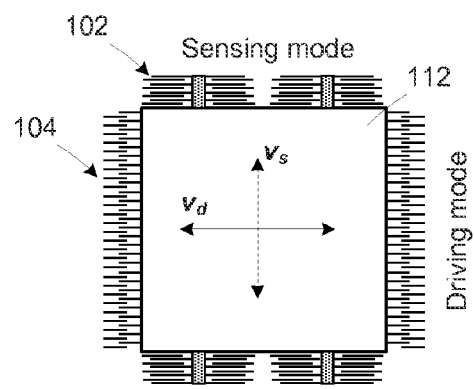
FIG. 2 is a top view of a typical existing capacitive MEMS gyroscope having a driving mode and a sensing mode, wherein both of the driving and sensing mode utilize capacitance structures.
Figure 3:
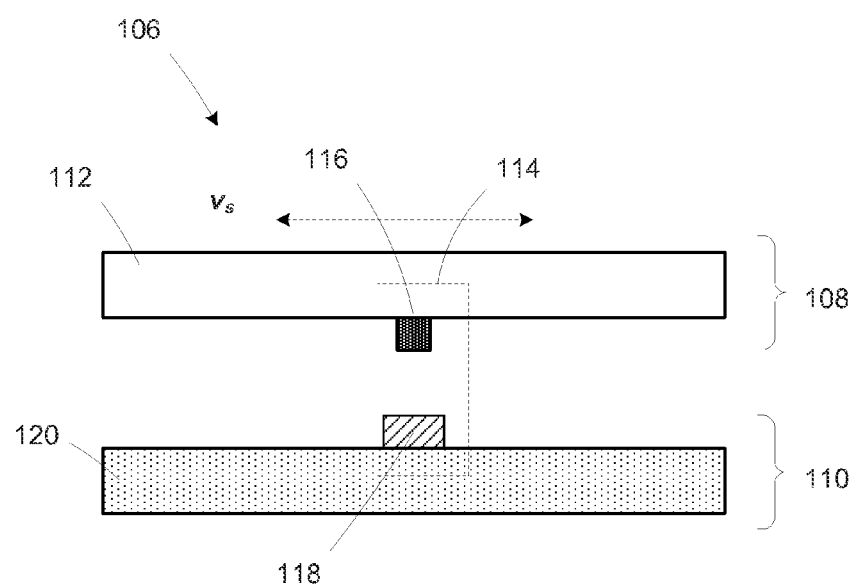
FIG. 3 illustrates an exemplary MEMS gyroscope having a magnetic sensing mechanism.

Referring to FIG. 3, an exemplary MEMS gyroscope is illustrated herein. In this example, MEMS gyroscope 106 comprises magnetic sensing mechanism 114 for sensing the target angular velocity through the measurement of proof-mass 112. Specifically, MEMS gyroscope 106 comprises mass-substrate 108 and sensor substrate 110. Mass-substrate 108 comprises proof-mass 112 that is capable of responding to an angular velocity. The two substrates (108 and 110) are spaced apart, by a pillar (not shown herein for simplicity) such that at least the proof-mass (112) is movable in response to an angular velocity under the Coriolis effect. The movement of the proof-mass (112) and thus the target angular velocity can be measured by magnetic sensing mechanism 114.

The magnetic sensing mechanism (114) in this example comprises a magnetic source 116 and magnetic sensor 118. The magnetic source (116) generates a magnetic field, and the magnetic sensor (118) detects the magnetic field and/or the magnetic field variations that is generated by the magnetic source (116). In the example illustrated herein in FIG. 3, the magnetic source is placed on/in the proof mass (112) and moves with the proof-mass (112). The magnetic sensor (118) is placed on/in the sensor substrate (120) and non-movable relative to the moving proof-mass (112) and the magnetic source (116). With this configuration, the movement of the proof-mass (112) can be measured from the measurement of the magnetic field from the magnetic source (116).

Other than placing the magnetic source on/in the movable proof-mass (112), the magnetic source (116) can be placed on/in the sensor substrate (120); and the magnetic sensor (118) can be placed on/in the proof-mass (112).

It is also noted that the MEMS gyroscope illustrated in FIG. 3 can also be used as an accelerometer.

Figure 4:
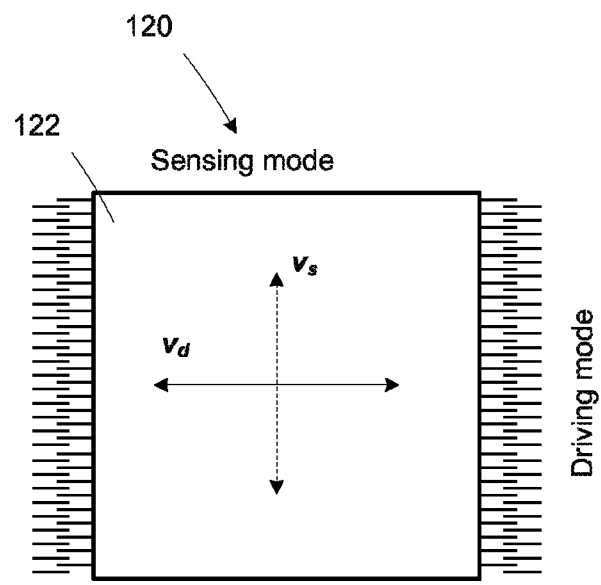
FIG. 4 illustrates a top view of a portion of an exemplary implementation of the MEMS gyroscope illustrated in FIG. 3, wherein the MEMS gyroscope illustrated in FIG. 4 having a capacitive driving mode and a magnetic sensing mechanism.

The MEMS gyroscope as discussed above with reference to FIG. 3 can be implemented in many ways, one of which is illustrated in FIG. 4. Referring to FIG. 4, the proof-mass (112) is driven by capacitive, such as capacitive comb. The sensing mode, however, is performed using the magnetic sensing mechanism illustrated in FIG. 3. For this reason, capacitive combs can be absent from the proof-mass (112).

Figure 5:
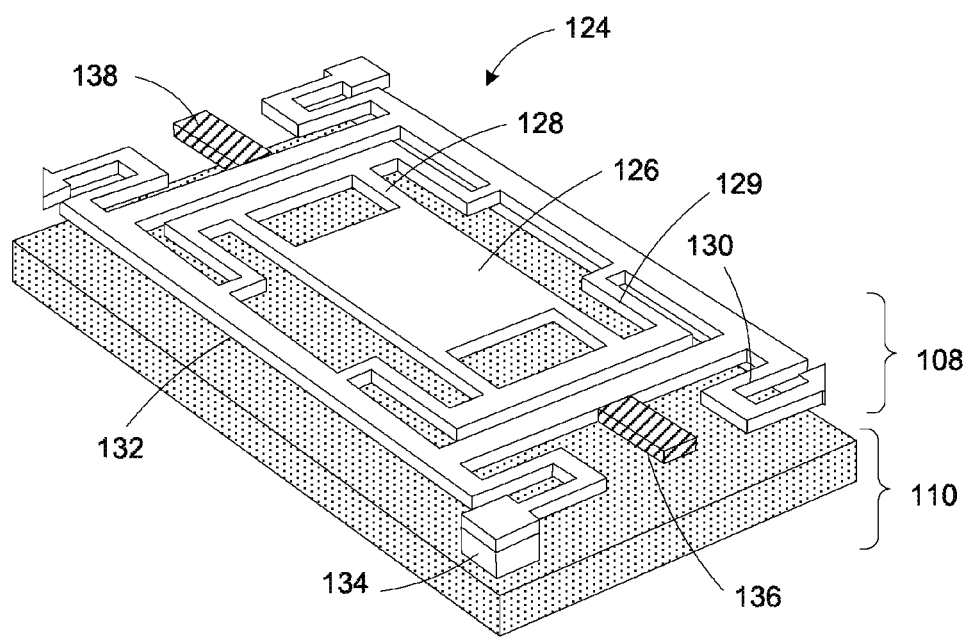
FIG. 5 illustrates a perspective view of a portion of another exemplary implementation of the MEMS gyroscope illustrated in FIG. 3, wherein the MEMS gyroscope illustrated in FIG. 5 having a magnetic driving mechanism for the driving mode and a magnetic sensing mechanism for the sensing mode

Alternatively, the proof-mass can be driven by magnetic force, an example of which is illustrated in FIG. 5. Referring to FIG. 5, the mass substrate (108) comprises a movable proof-mass (126) that is supported by flexible structures such as flexures 128, 129, and 130. The layout of the flexures enables the proof-mass to move in a plane substantially parallel to the major planes of mass substrate 108. In particular, the flexures enables the proof-mass to move along the length and the width directions, wherein the length direction can be the driving mode direction and the width direction can be the sensing mode direction of the MEMS gyro device. The proof-mass (126) is connected to frame 132 through flexures (128, 129, and 130). The frame (132) is anchored by non-movable structures such as pillar 134. The mass-substrate (108) and sensing substrate 110 are spaced apart by the pillar (134). The proof-mass (112) in this example is driving by a magnetic driving mechanism (136). Specifically, the proof-mass (126) can move (e.g. vibrate) in the driving mode under magnetic force applied by magnetic driving mechanism 136, which is better illustrated in FIG. 6.

Figure 6:
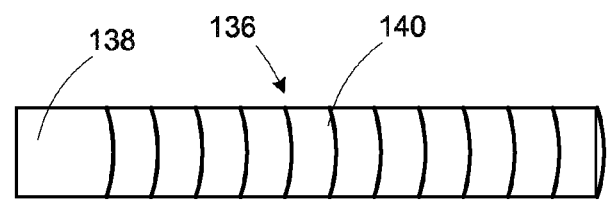
FIG. 6 illustrates an exemplary magnetic driving mechanism of the MEMS gyroscope in FIG. 5.

Referring to FIG. 6, the magnetic driving mechanism 136 comprise a magnet core 138 surrounded by coil 140. By applying an alternating current through coil 140, an alternating magnetic field can be generated from the coil 140. The alternating magnetic field applies magnetic force to the magnet core 140 so as to move the magnet core. The magnet core thus moves the proof-mass.

Figure 7:
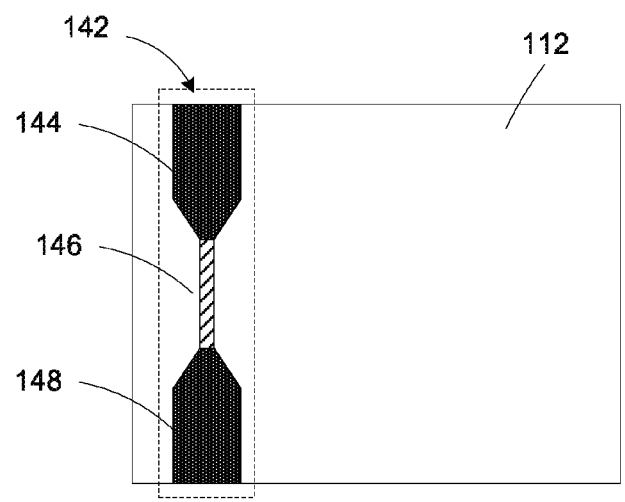
FIG. 7 illustrates an exemplary magnetic source of the MEMS gyroscope illustrated in FIG. 3.

The magnetic source (114) of the MEMS gyroscope (106) illustrated in FIG. 3 can be implemented in many ways, one of which is illustrated in FIG. 7. Referring to FIG. 7, conductive wire 142 is displaced on/in proof-mass 112. In one example, conductive wire 142 can be placed on the lower surface of the proof-mass (112), wherein the lower surface is facing the magnetic sensors (118 in FIG. 3) on the sensor substrate (110, in FIG. 3). Alternatively, the conductive wire (142) can be placed on the top surface of the proof-mass (112), i.e. on the opposite side of the proof-mass (112) in view of the magnetic sensor (118). In another example, the conductive wire (142) can be placed inside the proof-mass, e.g. laminated or embedded inside the proof-mass (112), which will not be detailed herein as those examples are obvious to those skilled in the art of the related technical field.

The conductive wire (142) can be implemented in many suitable ways, one of which is illustrated in FIG. 7. In this example, the conductive wire (142) comprises a center conductive segment 146 and tapered contacts 144 and 148 that extend the central conductive segment to terminals, through the terminals of which current can be driven through the central segment. The conductive wire (142) may have other configurations. For example, the contact tapered contacts (144 and 148) and the central segment (146) maybe U-shaped such that the tapered contacts may be substantially parallel but are substantially perpendicular to the central segment, which is not shown for its obviousness.

Figure 8:
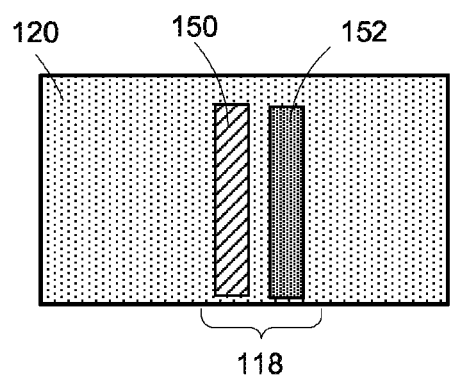
FIG. 8 illustrates an exemplary, magnetic sensing mechanism that can be used in the MEMS gyroscope illustrated in FIG. 3.

The magnetic sensor (118) illustrated in FIG. 3 can be implemented to comprise a reference sensor (150) and a signal sensor (152) as illustrated in FIG. 8. Referring to FIG. 8, magnetic sensor 118 on/in sensor substrate 120 comprises reference sensor 150 and signal sensor 152. The reference sensor (150) can be designated for dynamically measuring the magnetic signal background in which the target magnetic signal (e.g. the magnetic field from the conductive wire 146 as illustrated in FIG. 7) co-exists. The signal sensor (152) can be designated for dynamically measuring the target magnetic signal (e.g. the magnetic field from the conductive wire 146 as illustrated in FIG. 7). In other examples, the signal sensor (152) can be designated for dynamically measuring the magnetic signal background in which the target magnetic signal (e.g. the magnetic field from the conductive wire 146 as illustrated in FIG. 7) co-exists, while the signal sensor (150) can be designated for dynamically measuring the target magnetic signal (e.g. the magnetic field from the conductive wire 146 as illustrated in FIG. 7).

Figure 9:
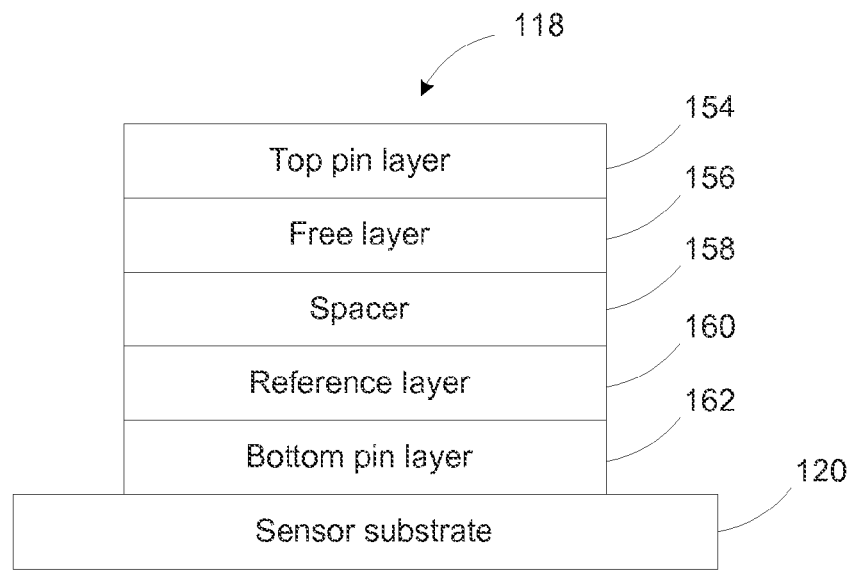
FIG. 9 shows an exemplary thin-film stack that can be configured into a CIP or CPP structure for use in the magnetic sensing mechanism illustrated in FIG. 8.

The reference sensor (150) and the signal sensor (152) preferably comprise magneto-resistors, such as AMRs, giant-magneto-resistors (such as spin-valves, hereafter SV), or tunneling-magneto-resistors (TAR). For demonstration purpose, FIG. 9 illustrates a magneto-resistor structure, which can be configured into CIP (current-in-plane, such as a spin-valve) or a CPP (current-perpendicular-to-plane, such as TMR structure). As illustrated in FIG. 9, the magneto-resistor stack comprises top pin-layer 154, free-layer 156, spacer 158, reference layer 160, bottom pin layer 162, and substrate 120. Top pin layer 154 is provided for magnetically pinning free layer 156. The top pin layer can be comprised of IrMn, PtMn or other suitable magnetic materials. The free layer (156) can be comprised of a ferromagnetic material, such as We, CoFe, CoFeB, or other suitbale materials or the combinations thereof. The spacer (158) can be comprised of a non-magnetic conductive material, such as Cu, or an oxide material, such as $Al_2O_3$ or MgO or other suitable materials. The reference layer (160) can be comprised of a ferromagnetic magnetic material, such as NiFe, CoFe, CoFeB, or other materials or the combinations thereof. The bottom pin layer (162) is provided for magnetic pinning the reference layer (160), which can be comprised of a IrMn, PtPMn or other suitable materials or the combinations thereof. The substrate (120) can be comprised of any suitable materials, such as glass, silicon, or other materials or the combinations thereof.

In examples wherein the spacer (158) is comprised of a non-magnetic conductive layer, such as Cu, the magneto-resistor (118) stack can be configured into a CIP structure (i.e. spin-valve, SV), wherein the current is driven in the plane of the stack layers. When the spacer (158) is comprised of an oxide such as $Al_2O_3$, MgO or the like, the magneto-resistor stack (118) can be configured into a CPP structure (i.e. TMR), wherein the current is driven perpendicularly to the stack layers.

In the example as illustrated in FIG. 9, the free layer (156) is magnetically pinned by the top pin layer (154), and the reference layer (160) is also magnetically pinned by bottom pin layer 162. The top pin layer (154) and the bottom pin layer (162) preferably having different blocking temperatures. In this specification, a blocking temperature is referred to as the temperature, above which the magnetic pin layer is magnetically decoupled with the associated pinned magnetic layer. For example, the top pin layer (154) is magnetically decoupled with the free layer (156) above the blocking temperature $T_B$ of the top pin layer (154) such that the free layer (156) is "freed" from the magnetic pinning of top pin layer (154). Equal to or below the blocking temperature $T_B$ of the top pin layer (154), the free layer (156) is magnetically pinned by the top pin layer (154) such that the magnetic orientation of the free layer (156) is substantially not affected by the external magnetic field. Similarly, the bottom pin layer (162) is magnetically decoupled with the reference layer (160) above the blocking temperature $T_B$ of the bottom pin layer (162) such that the reference layer (160) is "freed" from the magnetic pinning of bottom pin layer (162). Equal to or below the blocking temperature $T_B$ of the bottom pin layer (162), the reference layer (160) is magnetically pinned by the bottom pin layer (162) such that the magnetic orientation of the reference layer (162) is substantially not affected by the external magnetic field.

The top and bottom pin layers (154 and 162, respectively) preferably have different blocking temperatures. When the free layer (156) is "freed" from being pinned by the top pin layer (154), the reference layer (160) preferably remains being pinned by the bottom pin layer (162). Alternatively, when the free layer (156) is stilt pinned by the top pin layer (154), the reference layer (160) can be "freed" from being pinned by the bottom pin layer (162). In the later example, the reference layer (160) can be used as a "sensing layer" for responding to the external magnetic field such as the target magnetic field, while the free layer (156) is used as a reference layer to provide a reference magnetic orientation.

The different blocking temperatures can be accomplished by using different magnetic materials for the top pin layer (154) and bottom pin layer (162). In one example, the top pin layer (154) can be comprised of IrMn, while the bottom pin layer (162) can be comprised of PtMn, vice versa. In another example, both of the top and bottom pin layers (154 and 162) may be comprised of the same material, such as IrMn or PtMn, but with different thicknesses such that they have different blocking temperatures.

It is noted by those skilled in the art that the magneto-resistor stack (118) is configured into sensors for sensing magnetic signals. As such, the magnetic orientations of the free layer (156) and the reference layer (160) are substantially perpendicular at the initial state. Other layers, such as protective layer Ta, seed layers for growing the stack layers on substrate 120 can be provided. It is further noted that the magnetic stack layers (118) illustrated in FIG. 9 are what is often referred to as "bottom pin" configuration in the field of art. In other examples, the stack can be configured into what is often referred as "top pinned" configuration in the field of art, which will not be detailed herein.

Figure 10:
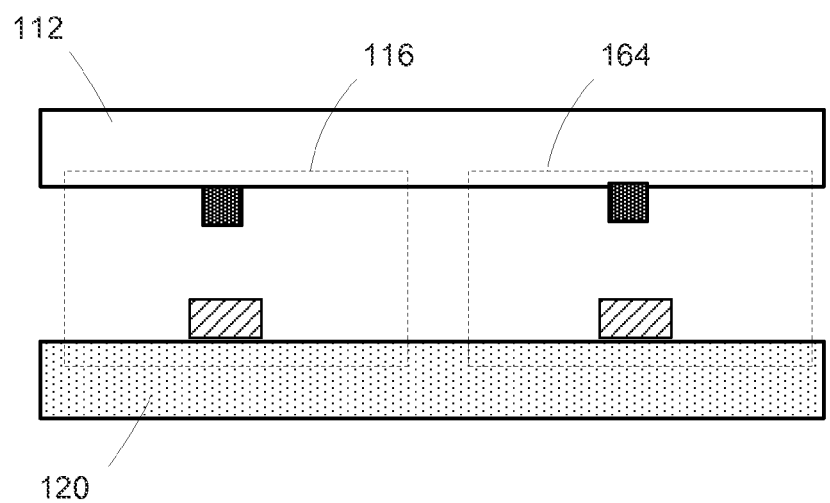
FIG. 10 illustrates an exemplary MEMS gyroscope that comprises multiple magnetic sensing structures.

In some applications, multiple magnetic sensing mechanisms can be provided, an example of which is illustrated in FIG. 10. Referring to FIG. 10, magnetic sensing mechanisms 116 and 164 are provided for detecting the movements of proof-mass 112. The multiple magnetic sensing mechanisms can be used for detecting the movements of proof-mass 112 in driving mode and sensing mode respectively. Alternatively, the multiple magnetic sensing mechanisms 116 and 164 can be provided for detecting the same modes (e.g. the driving mode and/or the sensing mode).

The MEMS gyroscope as discussed above can be fabricated in many ways. During fabrication, special concerns on the fact that magnetic sensor and MEMS proof-mass may having different properties need to be addressed. In some examples, the magnetic sensor comprises spintronic structures, such as spin-valve (SV), magnetic-tunnel-junction (MTJ) or other similar structures. These spintronic structures in general has a blocking temperature that is 220 C or less, which means that these spintronic structures can be processed at a temperature not higher than the blocking temperature. However, the MEMS structures generally are processed at a much higher temperature, such as 250 C or higher. IN particular, bonding the MEMS wafer having the proof-mass and the magnetic sensor wafer having the magnetic sensor generally requires a bonding temperature of 250 C or higher to secure a reliable bonding strength. This problem can be solved by using a localized heating, as illustrated in FIG. 11.

Figure 11:
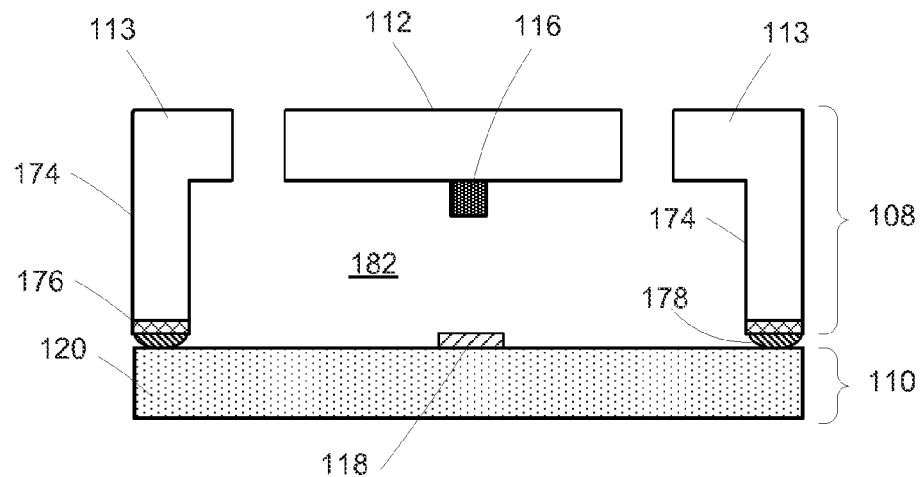
FIG. 11 illustrates an exemplary wafer bonding scheme for use in making the MEMS gyroscope shown in FIG. 3.

Referring to FIG. 11, MEMS wafer 108 comprises MEMS features such as proof-mass 112, beams (not shown), and frame 113 for supporting the proof-mass (112) above sensor wafer 110 and enable the motion of the proof-mass. The MEMS wafer (108) further comprises spacer 174 that is derived from the MEMS wafer 108 and localized heater 176 that is formed at the bottom surface of pillar 174 for generating localized heat. Bonding material 178, such as a glass frit, metal, metal alloy or other suitable bonding materials can be disposed at the bonding area wherein the localized heater (176) is disposed as illustrated in FIG. 11. Sensor wafer 110 is bonded to the MEMS wafer (108) though the bonding material (178) at the bonding area. In some examples, especially when the bonding material is conductive, such as metal or metal alloy, an insulating layer can be disposed between the localized heater (176) and bonding material 178. The bonding scheme is better illustrated in perspective view in FIG. 12.

Figure 12:
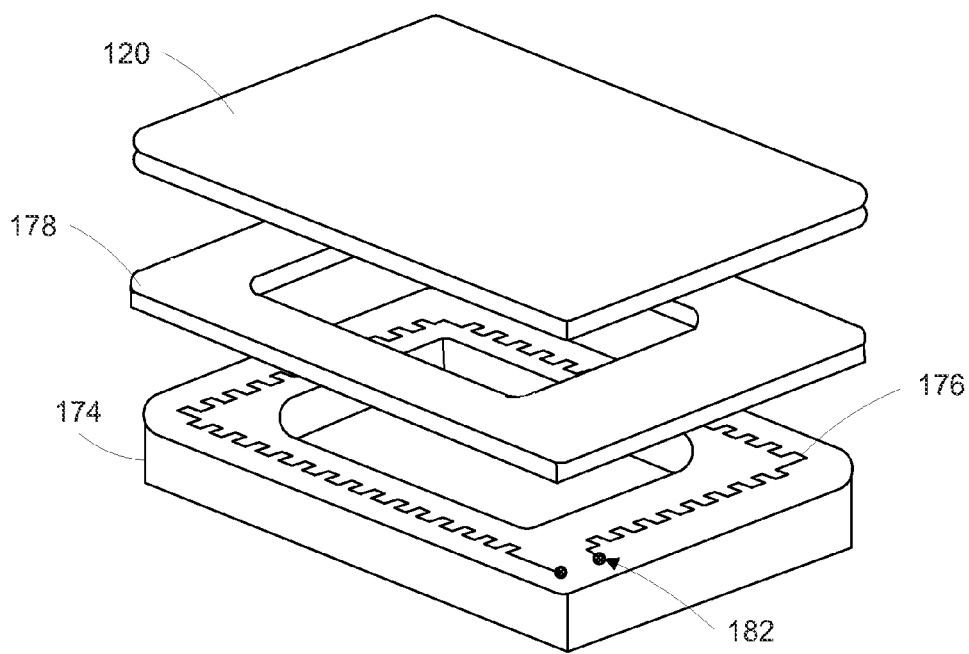
FIG. 12 illustrates a perspective view of the wafer bonding scheme in FIG. 11.

Referring to FIG. 12, localized heater 176 is disposed on the surface of pillar 174 wherein pillar 174 in this example forms a hermetic bonding even though not required in some examples. The localized heater is conductive such that it generates localized heating to raise the temperature in the vicinity of the heater when current is driven through. The localized heater has two terminals 182 for feeding current. Bonding material 178, which can be any suitable bonding materials, such as a glass frit, metal alloy, or metal can be disposed on the heater. In this way, the bonding material (178) and the pillar (174) laminate the localized heater therebetween. In some examples especially when the bonding material is conductive, an insulating layer can be disposed between the localized heater (176) and bonding material 178, which is not shown in the figure.

In a bonding process, current is driven into the localized heater through terminals 182. As current flows through the localized heater, the temperature in the vicinity of the heater (176) is elevated. When this temperature equals to or higher than the melting temperature of the bonding material 178, the pillar (174) can be bonded to the sensor wafer (120). In this bonding process pressure can be applied.

By using the localized heater (176), only the area in the vicinity of the heater (176) raises its temperature. The magnetic sensor may not experience temperature raise. As such, the bonding area (the area wherein the bonding material is disposed) can have a temperature higher than 220 C, such as 350 C or 400 C, while the area wherein the magnetic sensor is disposed may still keep a safe temperature that is lower than 200 C.

In the example shown in FIG. 12, pillar 174 forms a hermetic bonding. The same bonding scheme and process are also applicable in examples wherein the MEMS wafer and the magnetic sensor wafer are bonded non-hermetically. In those examples, multiple pillars can be provided; and each bonding area at individual pillars may be provided with a localized heater for generating localized heating. The MEMS wafer (108) with pillar 174 and localized heater 176 can be fabricated in many ways, one of which is illustrated in FIG. 13a to FIG. 13d.

Figure 13A:
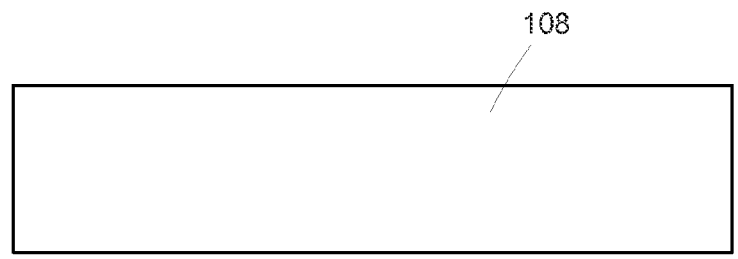
FIG. 13a to FIG. 13d illustrated an exemplary method of making bonding structures in a MEMS wafer.
Figure 13B:
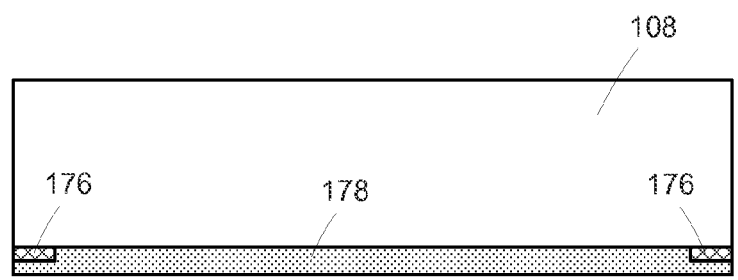

Referring to FIG. 13a, MEMS wafer 108, such as a SOI (silicon-oxide-insulator) wafer, is provided. Localized heater 176 is formed in the bonding area as shown in FIG. 13b. The bonding area is an area wherein the MEMS wafer and the sensor wafer is bonded. The localized heater (176) can be formed by depositing a conductive material such as copper on the bottom surface of the MEMS wafer (108) followed by photolithography and etching. Insulating layer 178 can be deposited on the patterned localized heater so as to protect the heater and provide insulation between the heater and the bonding material especially when the bonding material is conductive.

Figure 13C:
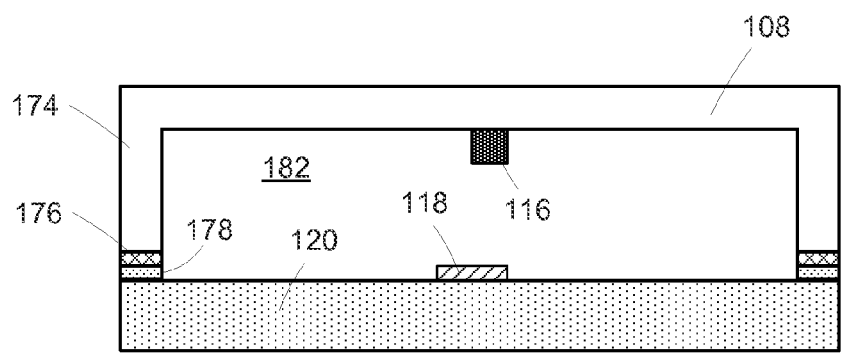

The MEMS wafer (108) having the patterned heater and insulating layer can be processed for forming pillars 174 as illustrated in FIG. 13c. Referring to FIG. 13c, MEMS wafer 108 is processed so as to form pillar 174 by using photolithography and etching. The patterned MEMS wafer (108) with pillar 174 comprises cavity 182, in which magnetic source 116 can then be formed. Bonding material 176 can be applied to the bonding area, especially at the area having the localized heater as shown in FIG. 13c. The patterned MEMS wafer (108) with pillar 174, heater 176 and bonding material 178 can be bonded to sensor wafer 120. During the bonding, current is driven through the heater and raises the temperature of the bonding material at the bonding area. If needed, pressure can be applied to the wafers.

Figure 13D:
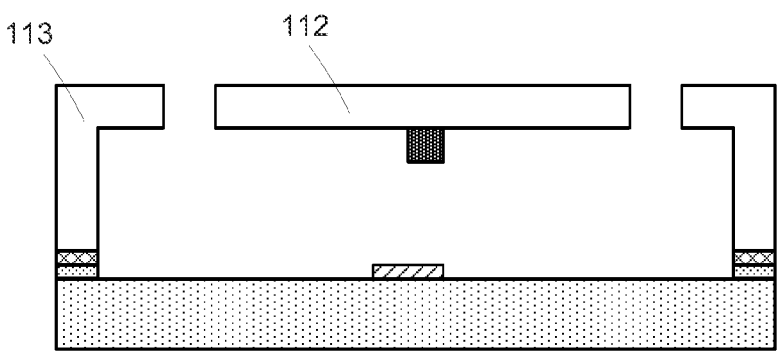

After the wafer bonding, the MEMS wafer (108) is further processed so as to form MEMS features, such as proof-mass 112, beams, and frames 113 as illustrated in FIG. 13d. The processed MEMS wafer (108) can be cleaned afterwards.

Figure 14A:
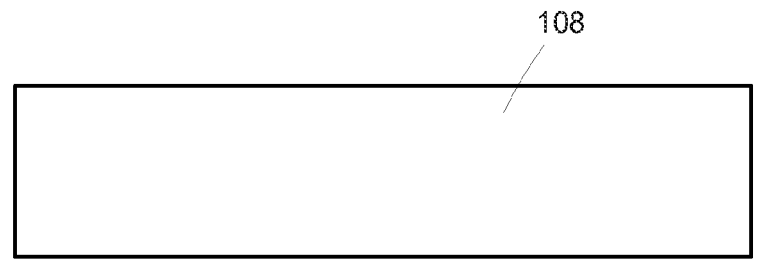
FIG. 14a to FIG. 14d illustrated another exemplary method of making bonding structures in a MEMS wafer.
Figure 14B:
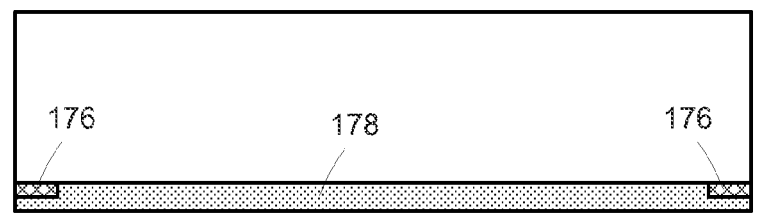

In another example, the MEMS wafer (108) can be processed to form MEMS features before bonding to the sensor wafer, a method of which is illustrated in FIG. 14a to FIG. 14d. Referring to FIG. 14a, MEMS wafer 108, such as a SOI (silicon-oxide-insulator) wafer, is provided. Localized heater 1176 is formed in the bonding area as shown in FIG. 14b. The localized heater (176) can be formed by depositing a conductive material such as copper on the bottom surface of the MEMS wafer (108) followed by photolithography and etching. Insulating layer 178 can be deposited on the patterned localized heater so as to protect the heater and provide insulation between the heater and the bonding material especially when the bonding material is conductive.

Figure 14C:
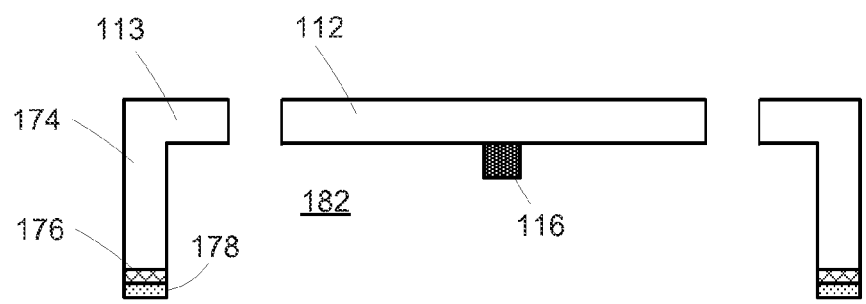

The MEMS wafer (108) having the patterned heater and insulating layer can be processed for forming pillars 174 as illustrated in FIG. 14c. Referring to FIG. 14c, MEMS wafer 108 is processed so as to form pillar 174 by using photolithography and etching. The patterned MEMS wafer (108) with pillar 174 comprises cavity 182, in which magnetic source 116 can then be formed. Bonding material 176 can be applied to the bonding area, especially at the area having the localized heater as shown in FIG. 14c.

Figure 14D:
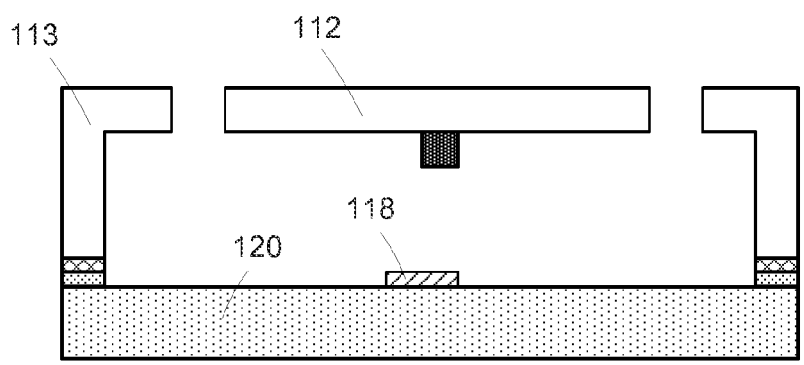

The MEMS wafer (108) can be further processed so as to form MEMS structures such as proof-mass 112, beams, and frame 113 as illustrated in FIG. 14d. The patterned MEMS wafer (108) with MEMS features, pillar 174, heater 176 and bonding material 178 can be bonded to sensor wafer 120. During the bonding, current is driven through the heater and raises the temperature of the bonding material at the bonding area. If needed, pressure can be applied to the wafers.

It will be appreciated by those of skilled in the art that a new and useful MEMS gyroscope has been described herein. In view of the many possible embodiments, however, it should be recognized that the embodiments described herein with respect to the drawing figures are meant to be illustrative only and should not be taken as limiting the scope of what is claimed. Those of skill in the art will recognize that the illustrated embodiments can be modified in arrangement and detail. Therefore, the devices and methods as described herein contemplate all such embodiments as may come within the scope of the following claims and equivalents thereof. In the claims, only elements denoted by the words "means for" are intended to be interpreted as means plus function claims under 35 U.S.C. § 112, the sixth paragraph.

We claim:
1. A method of making a microelectromechanical (MEMS) gyroscope, the method comprising:
    providing a first substrate;
    processing the first substrate, comprising:
    forming a heater in a bonding area, comprising:
    depositing a conductive material on a surface having the bonding area of the first substrate; and
    patterning the conductive material so as to form the heater;
    depositing an insulating layer on the patterned heater;
    patterning the first substrate so as to form a cavity surrounded by a pillar; and
    forming a magnetic source at a surface of a first MEMS wafer inside the cavity;

providing a second wafer that comprises a magnetic sensor;

bonding the first and second wafers at the bonding area so as to form a wafer assembly, further comprising:

driving current through the heater so as to raise temperature of a bonding material; and bonding the first and second wafer by using the bonding material at the raised temperature; and processing the first MEMS wafer of the wafer assembly so as to form a movable portion.

2. The method of claim 1, wherein the bonding material comprises a metal or a metal alloy.

3. The method of claim 2, wherein the magnetic sensor comprises a giant-magnetic-resistor.

4. The method of claim 2, wherein the magnetic sensors comprises a spin-valve structure.

5. The method of claim 2, wherein the magnetic sensors comprises a tunnel-magnetic-resistor.

6. The method of claim 2, wherein the magnetic sensor comprises a magnetic pickup coil that is an element of a fluxgate.

* * * * *